(12) United States Patent
Mingant et al.

(10) Patent No.: US 8,823,326 B2
(45) Date of Patent: Sep. 2, 2014

(54) METHOD FOR DETERMINING THE STATE OF CHARGE OF A BATTERY IN CHARGING OR DISCHARGING PHASE

(75) Inventors: Remy Mingant, Lannilis (FR); Christine Lefrou, Grenoble (FR); Yvan Reynier, Grenoble (FR)

(73) Assignees: Commissariat a l'Energie Atomique et aux Energies Alternatives, Paris (FR); Institut Polytechnique de Grenoble, Grenoble (RE)

( * ) Notice: Subject to any disclaimer, the term of this patent is extended or adjusted under 35 U.S.C. 154(b) by 706 days.

(21) Appl. No.: 13/125,688

(22) PCT Filed: Oct. 28, 2009

(86) PCT No.: PCT/EP2009/007732
§ 371 (c)(1),
(2), (4) Date: Apr. 22, 2011

(87) PCT Pub. No.: WO2010/049148
PCT Pub. Date: May 6, 2010

(65) Prior Publication Data
US 2011/0215761 A1 Sep. 8, 2011

(30) Foreign Application Priority Data
Oct. 30, 2008 (FR) .................................... 08 06045

(51) Int. Cl.
*H02J 7/00* (2006.01)
*G01R 31/36* (2006.01)

(52) U.S. Cl.
CPC .......... *G01R 31/3648* (2013.01); *G01R 31/362* (2013.01); *G01R 31/3624* (2013.01)
USPC .......................................... 320/132; 320/427

(58) Field of Classification Search
USPC ......................................................... 320/132
See application file for complete search history.

(56) References Cited

U.S. PATENT DOCUMENTS

2005/0231206 A1* 10/2005 Denning ........................ 324/430
2006/0202857 A1* 9/2006 Kawahara et al. ........ 340/870.02

FOREIGN PATENT DOCUMENTS

CN 1715944 A 1/2006
DE 102 03 810 A1 1/2003
(Continued)

OTHER PUBLICATIONS

Piller at al., "Methods for state-of-charge determination and their applications," *Journal of Power Sources*, 2001, vol. 96, pp. 113-120.
International Search Report in International Application No. PCT/EP2009/007732; dated Dec. 1, 2009 (with English-language translation).

(Continued)

*Primary Examiner* — Drew A Dunn
*Assistant Examiner* — Robert Grant
(74) *Attorney, Agent, or Firm* — Oliff PLC

(57) ABSTRACT

The method for determining the state of charge of a battery includes measurement of an electric parameter of the battery during a charging or discharging phase of the battery followed by placing the battery in open circuit during a rest period. During the rest period, at least two values of the voltage at the battery terminals are measured. An indicator is then calculated according to the electric parameter and to values of the voltage measured during the rest period, and the state of charge corresponding to this indicator is then determined by means of a calibration curve representative of the variations of the indicator as a function of the state of charge of the battery.

4 Claims, 3 Drawing Sheets

(56) References Cited

FOREIGN PATENT DOCUMENTS

| | | | |
|---|---|---|---|
| EP | 0 391 106 | A1 | 10/1990 |
| EP | 1 589 346 | A1 | 10/2005 |

OTHER PUBLICATIONS

Translation of Chinese Office Action issued in Chinese Patent Application No. 20098142608.5 dated Feb. 5, 2013.

* cited by examiner

METHOD FOR DETERMINING THE STATE OF CHARGE OF A BATTERY IN CHARGING OR DISCHARGING PHASE

BACKGROUND OF THE INVENTION

The invention relates to a method for determining the state of charge of a battery during a charging or discharging phase of the battery.

STATE OF THE ART

In lead batteries, the state of charge (SOC) conventionally varies over a wide range according to the voltage of the battery in open circuit (zero current), for example by an amplitude of more than one Volt as illustrated in FIG. 1 (article "Methods for state-of-charge determination and their applications" by Sabine Piller et al. published in 2001 in the "Journal of Power Sources" pages 113 to 120). The state of charge of these batteries can then be determined by simple potential measurement the precision of which depends on the precision of measurement of the voltage and on the slope of the discharge curve of the battery according to its state of charge.

The state of charge can also be determined from measurement of the voltage at non-zero current. The precision then depends on the precision of measurement of the voltage, but also of the current, on the slope of the curve characteristic of discharging of the battery according to its state of charge, and also on the estimation parameters of the battery voltage at non-zero current.

These methods by interpolation of the potential are not suitable for certain present-day batteries, in particular batteries of lithium-ion type with a cathode made from biphasic material, in which the voltage difference between charged state and discharged state is small. Indeed, as illustrated in FIG. 2, the variations of voltage U of the battery in volts as a function of the state of charge (SOC) are so small that, for a voltage of 3.3V, it is impossible to know whether the state of charge is closer to 40% than to 60%.

In known manner, the state of charge of a battery can also be determined by integration of the current as a function of time. The precision of an estimation using this method depends on the precision of current measurement. It is also necessary to know the initial capacity of the cell, the total charging capacity, and the faradic efficiency. One of the main shortcomings of this technology is the accumulation of errors cycle after cycle, inducing increasingly greater uncertainties (dependent on the estimations of the initial capacity of the cell and of its total capacity). This technique is therefore not applicable for long-term battery management.

OBJECT OF THE INVENTION

The object of the invention is to provide a method for determining state of charge that is precise and easy to implement.

This object is achieved by the fact that the method comprises the following successive steps in the course of said phase:
measurement of an electric parameter of the battery,
placing the battery in open circuit during a rest period,
measuring at least first and second values of the voltage at the terminals of the battery at different times during the rest period,
determining an indicator according to said electric parameter and to the voltage values measured during the rest period,
and determining the state of charge corresponding to the indicator by means of a calibration curve representative of the variations of the indicator as a function of the state of charge during the charging or discharging phase.

According to a development, the measured electric parameter is either the current I flowing through the battery before the latter is placed in open circuit or the voltage $U_{(t0)}$ at the terminals of the battery before the latter is placed in open circuit.

According to a first alternative using the voltage $U_{(t0)}$ at the battery terminals as parameter, the indicator ind1 is given by the formula $$ind1 = \frac{U_{(t2)} - \alpha}{U_{(t2)} - U_{(t1)}} \times (U_{(t1)} - U_{(t0)})$$

with $U_{(t1)}$ the first measure of voltage during the rest period, $U_{(t2)}$ the second measure of voltage during the rest period and α a parameter determined beforehand during a calibration phase by successive iterations of a to obtain a monotone calibration curve.

According to a second alternative using the current I as parameter, the indicator is given by the formula $$ind2 = \frac{U_{(t2)} - \alpha}{U_{(t2)} - U_{(t1)}} \times I$$

with $U_{(t1)}$ the first voltage value measured during the rest period, $U_{(t2)}$ the second voltage value measured during the rest period and α a parameter determined beforehand during a calibration phase by successive iterations of α to obtain a monotone calibration curve.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

Figure 1:
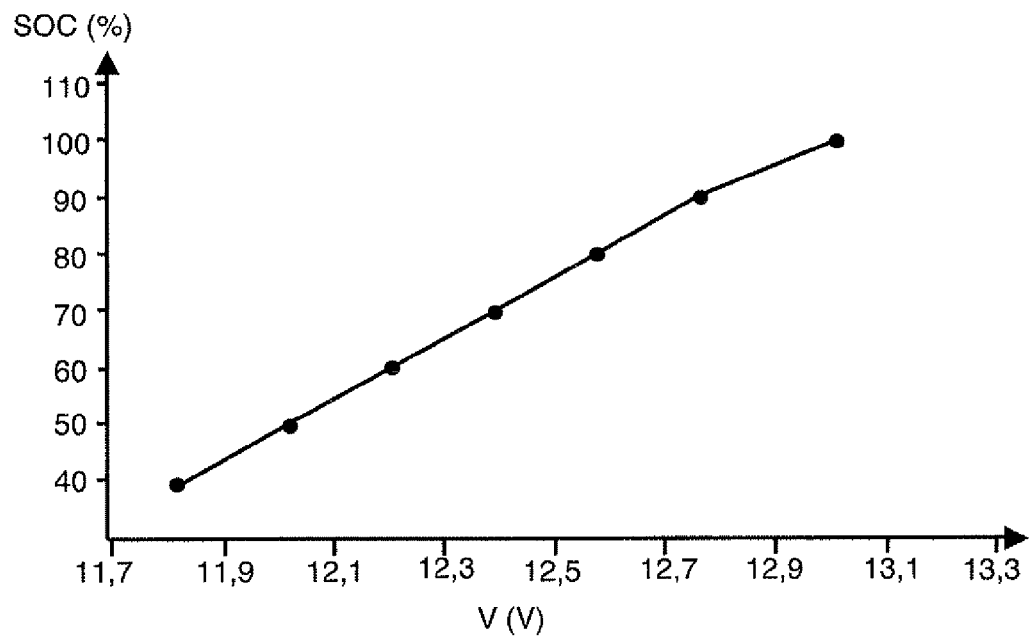
FIG. 1 represents a curve of determination of the state of charge of a battery by means of open-circuit voltage measurement according to the prior art.
Figure 2:
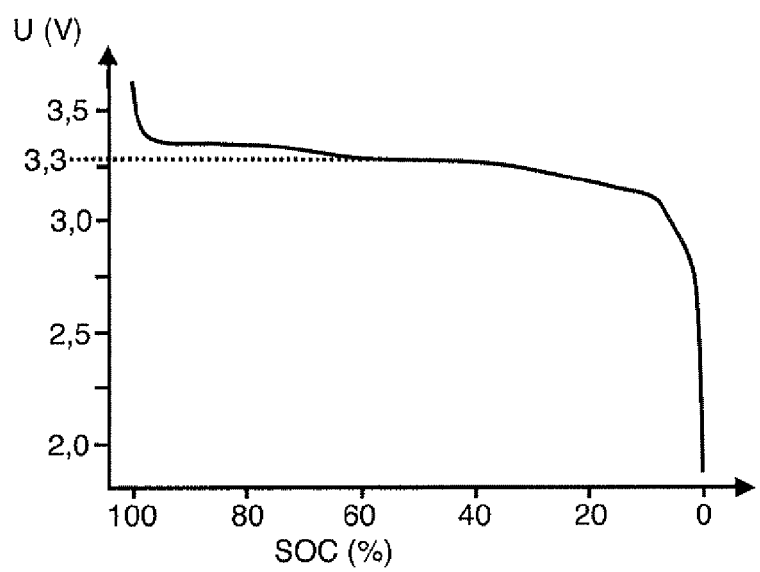
FIG. 2 illustrates the variation of the open-circuit voltage as a function of the state of charge of a lithium-ion battery.
Figure 3:
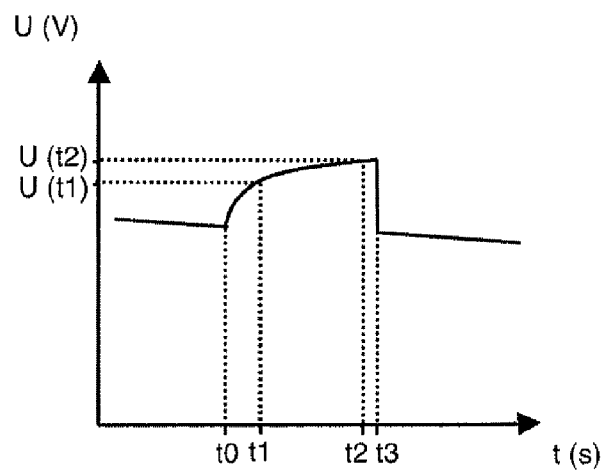
FIG. 3 represents the variation of the battery voltage as a function of time in the course of a discharging phase during a determination phase of the state of charge of the battery according to the invention.

As illustrated in FIG. 3, to determine the state of charge of a battery or of a storage battery during a charging or discharging phase, FIG. 3 represents the variation of the battery voltage as a function of time for a discharging phase with a step of determining the state of charge. An electric parameter of the battery is first of all measured before the battery is placed at rest between times t0 and t3. Placing the battery at rest corresponds to placing the latter in open circuit, which means that there is no current flowing through the battery. This placing at rest causes a variation of the voltage at the terminals of the battery. Typically this variation corresponds to an increase of the voltage if the battery is in a discharging phase (FIG. 3) or to a decrease of the voltage if the battery is in a charging phase (not represented). The rest period (t0-t3) is preferably shorter than or equal to 60 seconds, a time during which the voltage generally reaches the plateau voltage.

During the rest period (t0-t3), the values of the voltage at the battery terminals are measured at least at two different times t1 and t2. Time t2 can be equal to time t3, i.e. the voltage is measured just before the charging or discharging phase of the battery is resumed. An indicator is then determined from measurement of the electric parameter and of the voltage values $U_{(t1)}$ and $U_{(t2)}$ measured during the rest period t0-t3.

The indicator can be obtained in two different ways either by measurement of the current or by measurement of the voltage as electric parameter.

According to a first alternative, the electric parameter measured is the voltage U at the battery terminals before the rest period, i.e. at t0. After measurement during the rest period of at least two values of the voltage at times t1 and t2, the indicator can be determined by applying the formula:

$$ind1 = \frac{U_{(t2)} - \alpha}{U_{(t2)} - U_{(t1)}} \times (U_{(t1)} - U_{(t0)})$$

where $U_{(t1)}$ and $U_{(t2)}$ represent the voltages measured respectively at times t1 and t2,
α is a parameter depending on charging or discharging of the battery.

Figure 5:
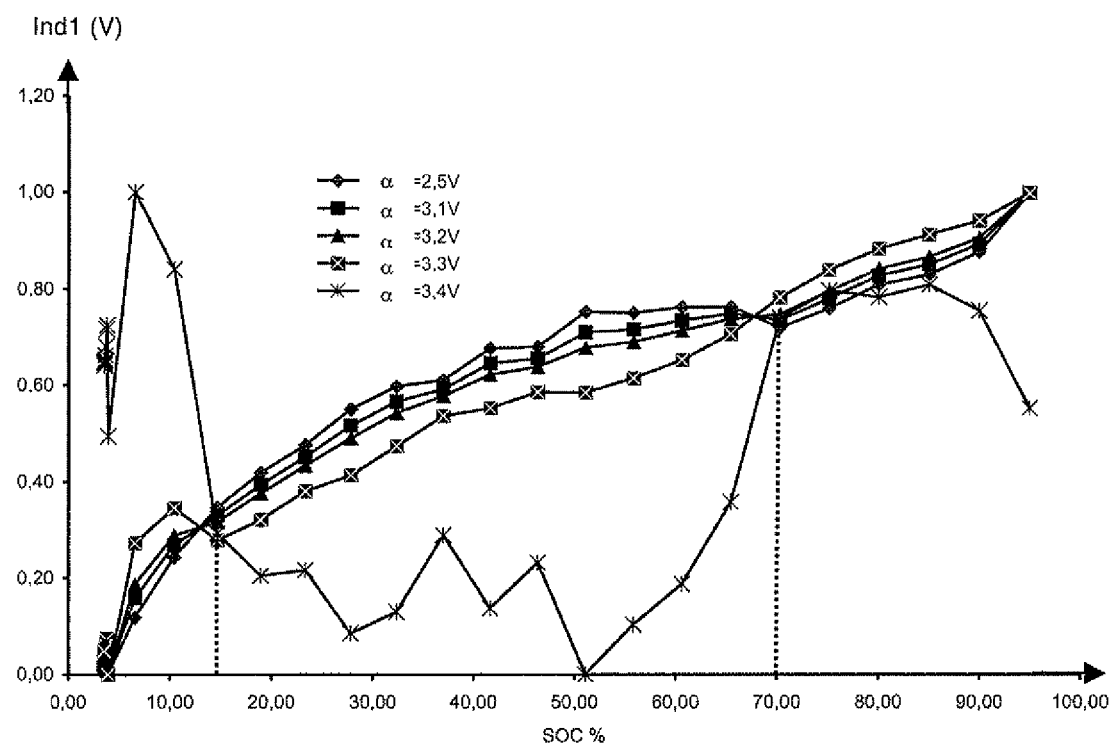
FIG. 5 illustrates different curves each associated with a different α, representative of the variation of the values of the indicator as a function of the state of charge.

Parameter α depends on the type of battery. It is determined beforehand during a calibration phase by successive iterations of possible values of α, for example between 0V and the rated voltage of the battery to obtain a monotone calibration curve representative of the indicator as a function of the state of charge. FIG. 5 represents the behavior of the variation of the values of the indicator as a function of the state of charge (SOC) for values of α respectively of 2.5V, 3.1V, 3.2V, 3.3V, and 3.4V for a discharge phase of 10 hours of a battery of LiFePO$_4$/LiC$_6$ type of 18650 format and 1.4 Ah capacity. The curve associated with the value of α=3.2V is the most monotone, i.e. it does not present any break in the slope or slope inversion. On the contrary, the curves associated with α=2.5V and α=3.1V present a break and an inversion of the slope at the level of a state of charge of 70%. Likewise, the curves associated with the value α=3.4V present a large number of slope breaks. As far as the curve associated with α=3.3V is concerned, a break is obtained for a state of charge of 15%. The curves not presenting monotony are not satisfactory because in this case, for the same indicator, a plurality of corresponding state-of-charge values can exist. For a battery of the type tested in FIG. 5, the value of α to be retained is therefore 3.2V.

Although in the above example α is determined by successive iterations during the calibration phase, it should be noted that its value is close to the mean potential on charging or discharging of the battery when the tested batteries have electrodes comprising the following materials LiFePO$_4$/ Graphite or LiFePO$_4$/Li$_4$Ti$_5$O$_{12}$. For LiFePO$_4$/Li$_4$Ti$_5$O$_{12}$, the corresponding α is 1.8V. The mean potential is defined by the ratio between battery energy (in W.h) and battery capacity (in A.h) for a given charging or discharging rate.

According to the second alternative, the measured electric parameter is current I flowing in the battery before the rest period, i.e. at t0. After current I has been measured, the battery is placed at rest for a period during which at least two voltage values are measured respectively at times t1 and t2. Indicator ind2 can then be determined by applying the formula:

$$ind2 = \frac{U_{(t2)} - \alpha}{U_{(t2)} - U_{(t1)}} \times I$$

where $U_{(t1)}$ and $U_{(t2)}$ represent the voltages measured respectively at times t1 and t2,
α is a parameter dependent on charging or discharging of the battery, determined in similar manner to the variant described above to obtain a monotone calibration curve.

Figure 4:
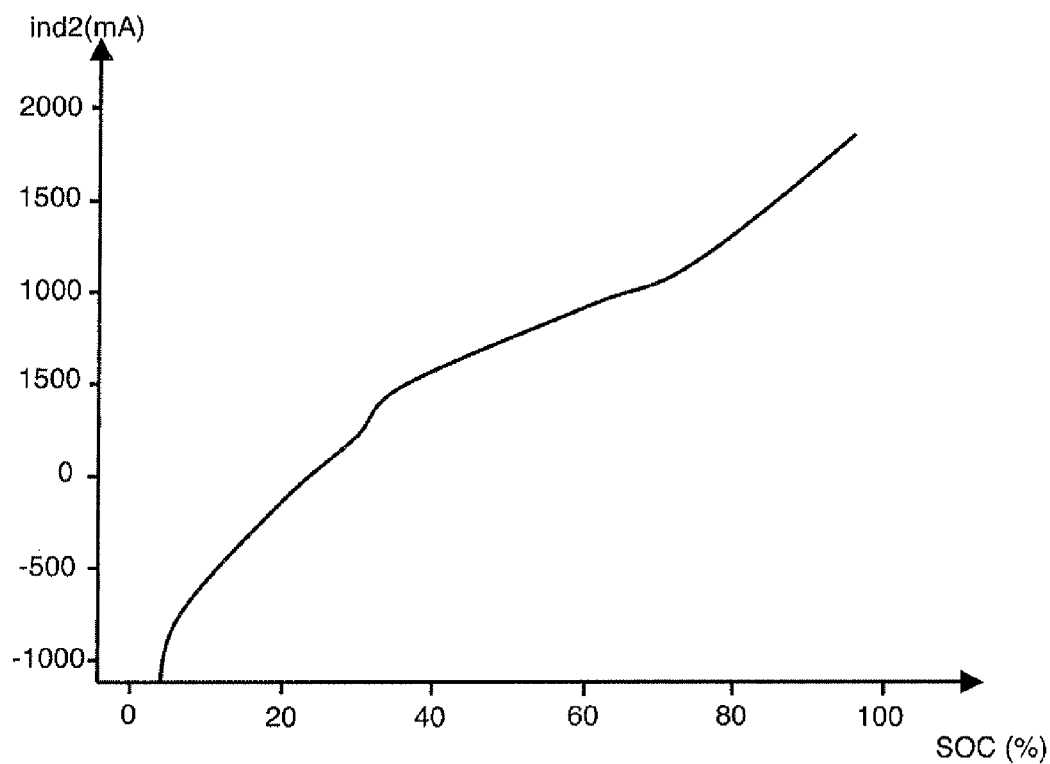
FIG. 4 illustrates a calibration curve representative of the indicator determined after the rest period as a function of the state of charge.

The indicator is then used to determine the state of charge (SOC) of the battery from the calibration curve (FIG. 4) obtained beforehand from a reference battery, this curve being representative of the variations of the indicator as a function of the state of charge of the battery during the charging or discharging phase. The calibration curve preferably provides the relation between the indicator and the state of charge of the battery for a predetermined α. The calibration curve used is preferably the one that enabled the best α to be determined. The curve of FIG. 4 represents the calibration curve corresponding to the variant where the amperage (ind2) flowing in the battery is measured as electric parameter. Two calibration curves have to be plotted as the calibration curves are in fact different whether a battery charging or discharging phase is involved. As illustrated in FIG. 4, the calibration curve represents the variation of indicator ind2 as a function of the state of charge of the battery during a discharging phase. This curve was obtained during the calibration phase by successive iterations of α already described in the foregoing. Tests made on three reference batteries of identical brand showed a small dispersion of results enabling a high reproducibility of measurement to be obtained with a standard deviation of less than 5%.

Thus, according to an embodiment, for a cylindrical LiFePO$_4$/LiC$_6$ cell of 18650 format and 1.4 Ah capacity in discharging phase and for a rest period of 30 seconds with t2=t3, calculation of ind2 gives:

$$ind2 = \frac{U_{(30s)} - 3.2}{U_{(30s)} - U_{(1s)}} \times I$$

with U(30 s)=3.25V, U(1 s)=3.21V and I=0.07 A for a discharging phase of the battery of 20 hours. A value of ind2 of 0.0875 A is thereby obtained.

By reading the curve of FIG. 4, an estimation value of the state of charge (SOC) of 25% is obtained.

This same calculation performed for a second voltage measured at t2=1 s instead of t2=30 s also shows a good monotony of the calibration curve with a standard deviation of less than 20% of the state of charge.

The method according to the invention is suitable for the chemistry of the battery, in particular making it possible to determine the state of charge of a battery having a pair of electrodes comprising either one or both electrodes made from biphasic material. The method is more particularly suitable for batteries comprising $LiFePO_4$ and $Li_4Ti_5O_{12}$ electrode materials. Establishing the state of charge of such batteries is achieved with great precision with an uncertainty of less than 10%, whereas the uncertainty is more than 15% with prior-art methods. Neither is it necessary to integrate a memory and a circuit performing corrections according to the data relating to previous chargings and dischargings of the battery.

This particularly interesting method can be applied in the photovoltaic field. It can also be applied in the field of portable devices, such as phones and computers, or in the field of hybrid and electric vehicles where it is critical to use precise charge gauges.

The invention claimed is:

1. A method for determining the state of charge of a battery during a charging or discharging phase of the battery, wherein the method comprises the following successive steps during said phase:
   measuring the current I flowing through the battery before the battery is placed in open circuit,
   placing the battery in open circuit during a rest period,
   measuring at least first and second values of the voltage at the terminals of the battery at different times during the rest period,
   determining an indicator ind2 based on the current I and the voltage values measured during the rest period, the indicator ind2 being given by the formula $$ind2 = \frac{U_{(t2)} - \alpha}{U_{(t2)} - U_{(t1)}} \times I$$

where $U_{(t1)}$ is the first voltage value measured during the rest period, $U_{(t2)}$ is the second voltage value measured during the rest period, and $\alpha$ is a parameter determined beforehand during a calibration phase by successive iterations of $\alpha$, to obtain a monotone calibration curve,
   and determining the state of charge corresponding to the indicator ind2 by means of a calibration curve representative of the variations of the indicator ind2 as a function of the state of charge during the charging or discharging phase.

2. A method for determining the state of charge of a battery during a charging or discharging phase of the battery, wherein the method comprises the following successive steps in the course of said phase:
   measuring the voltage $U_{(t0)}$ at the battery terminals before the battery is placed in open circuit,
   placing the battery in open circuit during a rest period,
   measuring at least first and second values of the voltage at the terminals of the battery at different times during the rest period,
   determining an indicator ind1 based on the voltage $U_{(t0)}$ and the voltage values measured during the rest period, the indicator ind1 being given by the formula $$ind1 = \frac{U_{(t2)} - \alpha}{U_{(t2)} - U_{(t1)}} \times (U_{(t1)} - U_{(t0)})$$

where $U_{(t1)}$ is the first measure of voltage during the rest period, $U_{(t2)}$ is the second measure of voltage during the rest period, and $\alpha$ is a parameter determined beforehand during a calibration phase by successive iterations of $\alpha$, to obtain a monotone calibration curve,
   and determining the state of charge corresponding to the indicator ind1 by means of a calibration curve representative of the variations of the indicator ind1 as a function of the state of charge during the charging or discharging phase.

3. The method according to claim 1 wherein the rest period has a duration less than or equal to 60 seconds.

4. The method according to claim 2 wherein the rest period has a duration less than or equal to 60 seconds.

* * * * *